United States Patent [19]

Boyko et al.

[11] Patent Number: 4,960,634

[45] Date of Patent: Oct. 2, 1990

[54] EPOXY COMPOSITION OF INCREASED THERMAL CONDUCTIVITY AND USE THEREOF

[75] Inventors: Christina M. Boyko, Conklin, N.Y.; Craig N. Johnston, Nicholasville, Ky.; James R. Loomis, Binghampton, N.Y.; Carl E. Samuelson, Johnson City, N.Y.; Ricahrd A. Schumacher, Endicott, N.Y.

[73] Assignee: International Business Machines Corporation, Armonk, N.Y.

[21] Appl. No.: 494,807

[22] Filed: Mar. 14, 1990

[51] Int. Cl.$^5$ .................... B32B 7/00; C08K 3/22; B05D 3/02

[52] U.S. Cl. .................... 428/220; 427/386; 428/209; 523/428; 523/454; 523/459

[58] Field of Search .......... 523/428, 454, 459; 428/242, 209, 220; 427/386

[56] References Cited

U.S. PATENT DOCUMENTS

| | | | |
|---|---|---|---|
| 3,492,535 | 1/1970 | Behrendt | 317/100 |
| 3,523,037 | 8/1970 | Chellis | 523/454 |
| 3,527,720 | 9/1970 | Groff | 260/18 |
| 3,641,195 | 2/1972 | Ball et al. | 260/837 |
| 3,763,087 | 10/1973 | Holub et al. | 260/41 |
| 3,801,427 | 4/1974 | Morishita et al. | 161/162 |
| 3,898,422 | 8/1975 | Fuller et al. | 219/201 |
| 3,908,040 | 9/1975 | Dauksys | 427/58 |
| 3,928,668 | 12/1975 | Snow | 427/14 |
| 3,972,821 | 8/1976 | Weidenbenner et al. | 252/75 |
| 4,018,944 | 4/1977 | Hallstrom et al. | 427/140 |
| 4,092,487 | 5/1978 | Imai | 174/52 |
| 4,092,697 | 5/1978 | Spaight | 361/386 |
| 4,145,327 | 3/1979 | Dolch et al. | 260/29.6 |
| 4,159,221 | 6/1979 | Schuessler | 156/285 |
| 4,175,152 | 11/1979 | Carnahan et al. | 428/242 |
| 4,233,620 | 11/1980 | Darrow et al. | 357/74 |
| 4,265,775 | 5/1981 | Aakalu et al. | 252/573 |
| 4,268,337 | 5/1981 | Ibata et al. | 156/244 |
| 4,371,579 | 2/1983 | McCaskey et al. | 428/204 |
| 4,372,347 | 2/1983 | Olson | 139/420 |
| 4,546,410 | 10/1985 | Kaufman | 361/387 |
| 4,574,879 | 3/1986 | DeGree et al. | 165/185 |
| 4,581,158 | 4/1986 | Lin | 252/511 |
| 4,593,052 | 6/1986 | Irving | 522/31 |
| 4,596,840 | 6/1986 | Hesse et al. | 523/400 |
| 4,601,916 | 7/1986 | Arachtingi | 427/97 |
| 4,642,321 | 2/1987 | Schoenberg et al. | 523/400 |
| 4,647,402 | 3/1987 | Tamura | 252/511 |
| 4,661,301 | 4/1987 | Okada et al. | 264/41 |
| 4,685,987 | 8/1987 | Fick | 156/247 |
| 4,689,110 | 8/1987 | Leibowitz | 156/634 |
| 4,725,650 | 2/1988 | Landi et al. | 525/524 |
| 4,730,666 | 3/1988 | Flint et al. | 165/80.4 |
| 4,740,425 | 4/1988 | Leland et al. | 428/447 |
| 4,803,115 | 2/1989 | Fushiki et al. | 428/246 |
| 4,810,563 | 3/1989 | DeGree et al. | 428/209 |
| 4,849,856 | 7/1989 | Funari et al. | 361/386 |

FOREIGN PATENT DOCUMENTS

| | | |
|---|---|---|
| 3711238 | 10/1987 | Fed. Rep. of Germany. |
| 55-109623 | 3/1980 | Japan. |
| 5076562 | 5/1980 | Japan. |
| 60-190344 | 9/1985 | Japan. |
| 60-190345 | 9/1985 | Japan. |
| 60-190346 | 9/1985 | Japan. |

OTHER PUBLICATIONS

"Handbook of Fillers for Plastics", Katz et al., Van Nostrand Reinhold Co., 1987, Section 2.2.7 and Table 12-1.

"Technology of Paints, Varnishes and Lacquers", pp. 354–355.

Wong, "Heat Sink Encapsulant", IBM Technical Disclosure Bulletin, vol. 9, No. 3, Aug. 1966, p. 224.

Electronics Products Magazine, Jul. 1968, Epoxies for Packaging.

Doo et al., "Method of Effective Cooling of a High Power Silicon Chip", IBM Technical Disclosure Bulletin, vol. 20, No. 4, Sep. 1977, pp. 1436 and 1437.

Yeh, "Bump Internal–Thermal Enhancement", IBM Technical Disclosure Bulletin, vol. 27, No. 7B, Dec. 1984, pp. 4413–4415.

Buller et al., "Module Process Compatible Thermally Ehanced Fin Attach Process", IBM Technical Disclosure Bulletin, vol. 24, No. 1B, Jun. 1981, p. 863.

Irish et al., "Enhanced Adhesion and Thermal Conductivity of Epoxy Sealant", IBM Technical Disclosure Bulletin, vol. 28, No. 11, Apr. 1986, p. 4710.

Materials Selector, Mid–Sep. 1973, pp. 17 et seq.

Tuckerman, "Heat-Transfer Microstructures for Integrated Circuits", Lawrence Livermore National Laboratory, University of California, Feb. 1984.

*Primary Examiner*—Lewis T. Jacobs
*Attorney, Agent, or Firm*—Pollock, Vande Sande & Priddy

[57] ABSTRACT

A composition of enhanced thermal conductivity which comprises a tetrabrominated diglycidyl ether polyepoxide; and epoxy polymer having an epoxy functionality of 3.5 to 6; zinc oxide and curing agents; and use thereof.

15 Claims, No Drawings

EPOXY COMPOSITION OF INCREASED THERMAL CONDUCTIVITY AND USE THEREOF

This application is a continuation of Ser. No. 07/294,090 filed on Dec. 29, 1988, now abandoned.

TECHNICAL FIELD

The present invention is concerned with epoxy compositions and especially epoxy compositions that exhibit increased thermal conductivity characteristics. The compositions of the present invention are used to impregnate glass fabrics from which multilayer laminates are prepared for use as printed circuit boards or cards of increased thermal conductivity. In addition, the present invention is concerned with a method of impregnating glass fabrics with the epoxy compositions of the present invention.

BACKGROUND ART

Circuit boards and circuit cards find a wide variety of uses in the electronics industry.

A widely employed technique for preparing such is to impregnate a woven fiberglass sheet with a resin composition and then laminate a copper sheet to one or both sides of the resin impregnated fiberglass sheet. Next, an electrical circuit is etched into the copper to form the circuit board or card and then electrical connections can be soldered to it when it is used.

Various resins have been suggested for the purpose of impregnating the fiberglass.

For example, epoxy resin laminated impregnated glass fabrics are widely used in the preparation of printed circuit boards and cards. The epoxy compositions for such purpose should possess a number of important characteristics. For example, such are required to be solvent resistant since they are repeatedly exposed to processing solvents and their vapors. For example, photoresists are stripped from the surface of metal and bonded to the surface of the laminate by exposing the photoresist to halogenated hydrocarbons.

Resin composition, when cured, should desirably exhibit a relatively high glass transition temperature and possess high resistance to elevated temperatures. Accordingly, compositions to be suitable as the matrix material for integrated circuit boards must possess a number of diverse characteristics including relatively high glass transition temperature when cured, solubility and stability in low boiling point solvents, adhesion to the fiberglass sheets, low thermal expansion, and high electrical resistivity.

Furthermore, the laminates should also be self-extinguishing (i.e., the epoxy impregnant should be a fire retardant).

A number of epoxy-containing compositions have been suggested for such purposes and include those compositions disclosed in U.S. Pat. Nos. 3,523,037; 4,294,877; 4,294,743; and 4,550,128, disclosures of which are incorporated herein by reference.

In particular, epoxy compositions along the lines of the disclosure of U.S. Pat. No. 3,523,037 has been used in the preparation of power supply modules. Typically, power supply modules consist of a number of components surface mounted onto a circuitized card. The card consists of a thick copper plate (either 20 or 40 mil), a thin layer of the epoxy-fiberglass dielectric (one or two plies of prepreg), and three ounce copper circuitry.

Although these cards or boards are satisfactory for the most part, the thermal conductance of the dielectric could stand improvement. In particular, the ability of this type of card to transfer heat away from the components which have maximum allowable operating temperature of 110° C. is very limited by the thermal conductance of the dielectric (the conductance of copper is very high). Therefore, increase in the thermal conductance of the dielectric layer would be desirable in order to extend current power supply packaging to higher power and higher thermal flux (increased power, constant card area) applications.

SUMMARY OF INVENTION

The present invention provides an epoxy composition having increased thermal conductivity without a concomitant loss to any undesired extent in the other necessary properties for use in preparing printed circuit boards or cards. Accordingly, the present invention provides for the handling of heat load generated by surface mounted components on the more advanced circuitized cards. In addition, the impregnated glass fabrics, according to the present invention, exhibit dimensional stability and uniform spacing, while being relatively easy to fabricate.

In particular, the compositions of the present invention contain:

(A) about 70 to 90 parts per 100 parts by weight of resin solids of a polyepoxide being tetrabrominated diglycidyl ether of a phenol;

(B) about 10 to about 30 parts per 100 parts by weight of resin solids of an epoxy polymer having functionality of about 3.5 to about 6;

(C) about 40 to about 75 parts by weight per 100 parts of resin solids of zinc oxide;

(D) about 3 to about 4 parts per 100 parts by weight of resin solids of dicyandiamide;

(E) about 0.2 to about 0.4 parts per 100 parts by weight of resin solids of a tertiary amine.

In addition, the present invention is concerned with an article that includes glass fabric impregnated with the above disclosed composition.

The present invention is also concerned with a method of preparing prepreg. The method includes immersing woven glass fiber in the above disclosed composition and then passing the epoxy impregnated glass fabric through an oven at temperatures of about 300° F. to about 350° F. to partially cure the composition.

BEST AND VARIOUS MODES FOR CARRYING OUT INVENTION

The compositions of the present invention include a brominated polyepoxide which is a tetrabrominated diglycidyl ether of a phenol.

The brominated epoxy polymers (i.e., tetrabrominated diglycidyl ether of a phenol) are known and commercially available.

Such can be obtained by reacting a brominated bisphenol such as tetrabrominated bisphenol-A with a halo-epoxy alkane. The halo-epoxy alkanes can be represented by the formula:

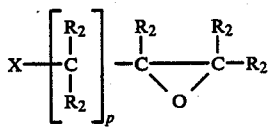

wherein X is a halogen atom (e.g., chlorine, bromine, and the like), p is an integer from 1–8, each $R_2$ individually is hydrogen or alkyl group of up to 7 carbon atoms; wherein the number of carbon atoms in any epoxy alkyl group totals no more than 10 carbon atoms.

The preferred brominated epoxy polymers have an epoxy equivalent of about 455 to about 500.

The preferred polyepoxide has a functionality of about 2, an epoxide equivalent weight about 455 to 500, and a bromine content of about 19% to 23% by weight. It is supplied by the Ciba Products Co. under the trade name Araldite 8011 as a solution containing 75% epoxy resin by weight in methyl ethyl ketone or by Dow Chemical Co. under the trade name DER-511 as an 80% solution in methyl ethyl ketone.

Of course, mixtures of the brominated polyepoxides can be employed if desired. The brominated polyepoxide is employed in amounts of about 70 to about 90 parts per 100 parts by weight of polymer solids in the composition.

The compositions of the present invention also contain an epoxy polymer having functionality of about 3.5 to about 6.

Examples of such epoxy polymers are epoxidized phenolic novolak polymers.

The epoxidized novolak polymers are commercially available and can be prepared by known methods by the reaction of a thermoplastic phenolic aldehyde of a phenol with a halo-epoxy alkane.

The epoxidized novolak polymers can be represented by the formula:

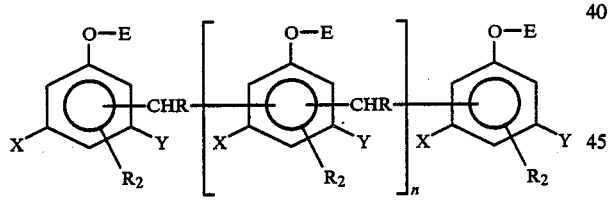

wherein n is at least about 0.2; E is hydrogen or an epoxyalkyl group, on the average at least 3.5 E groups per polymer molecule being an epoxyalkyl group and wherein the epoxyalkyl group is represented by the formula:

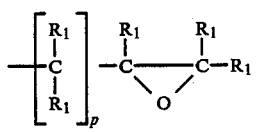

p is an integer from 1–8; R is hydrogen or alkyl or alkylene or aryl or aralkyl or alkaryl or cycloalkyl or furyl group; each $R_1$ individually is hydrogen or alkyl group of up to 7 carbon atoms; wherein the number of carbon atoms in any epoxyalkyl group totals no more than 10 carbon atoms; each X and Y is individually hydrogen or chlorine or alkyl or hydroxy; each $R_2$ individually is hydrogen or chlorine or a hydrocarbon group such as alkyl, aryl, aralkyl, alkaryl, and cycloalkyl.

The epoxy novolaks can be prepared by known methods by the reaction of a thermoplastic phenolic-aldehyde polymer of a phenol having the formula:

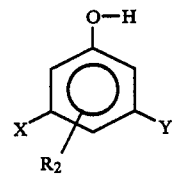

(wherein X, Y, and $R_2$ have the meanings as defined above) with a halo-epoxy alkane of the formula:

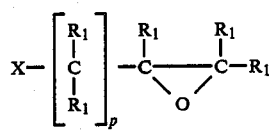

wherein X is a halogen atom (e.g., chlorine, bromine, and the like) and p and $R_1$ have the same meanings as defined hereinabove.

Hydrocarbon-substituted phenols having two available positions ortho or para to a phenolic hydroxy group for aldehyde condensation to provide polymers suitable for the preparation of epoxy novolaks include o- and p-cresols, o- and p-ethyl phenols, o- and p-isopropyl phenols, o- and –tert-butyl phenols, o- and p-sec-butyl phenols, o- and p-amyl phenols, o- and p-octyl phenols, o- and p-nonyl phenols, 2,5-xylenol, 3,4-xylenol, 2,5-diethyl phenol, 3,4-diethyl xylenol, 2,5-diisopropyl phenol, 4-methyl resorcinol, 4-ethyl resorcinol, 4-isopropyl resorcinol, 4-tert-butyl resorcinol, o- and p-benzyl phenyl, o- and p-phenethyl phenols, o- and p-phenyl phenols, o- and p-tolyl phenols, o- and p-cyclopentyl phenols, 4-phenethyl resorcinol, 4-tolyl resorcinol, 4-cyclohexyl resorcinol.

Various chloro-substituted phenols which can also be used in the preparation of phenol-aldehyde resins suitable for the preparation of the epoxy novolaks include o- and p-chloro-phenols, 2,5-dichloro-phenol, 2,3-dichloro-phenol, 3,4-dichloro-phenol, 2-chloro-3-methyl-phenol, 2-chloro-5-methyl-phenol, 3-chloro-2-methyl-phenol, 5-chloro-2-methyl-phenol, 3-chloro-4-methyl-phenol, 4-chloro-3-methyl-phenol, 4-chloro-3-ethyl-phenol, 4-chloro-3-isopropyl-phenol, 3-chloro-4-phenyl-phenol, 3-chloro-4-chloro-phenyl-phenol, 3,5-dichloro-4-methyl-phenol, 3,5-dichloro-5-methyl-phenol, 3,5-dichloro-2-methyl-phenol, 2,3-dichloro-5-methylphenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,4-dimethyl-phenol, 2,3,5-trichloro-phenol, 3,4,5-trichloro-phenol, 4-chloro-resorcinol, 4,5-dichloro-resorcinol, 4-chloro-5-methyl-resorcinol, 5-chloro-4-methyl-resorcinol.

Typical phenols which have more than two positions ortho or para to a phenolic hydroxy group available for aldehyde condensation and which, by controlled aldehyde condensation, can also be used are: phenol, m-cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol, 5-ethyl resorcinol.

As condensing agents any aldehyde may be used which will condense with the particular phenol being used, including formaldehyde, acetaldehyde, propionaldehyde, butyraldehyde, heptaldehyde, cyclohexanone, methyl cyclohexanone, cyclopentanone, benzaldehyde, and nuclear alkyl-substituted benzaldehydes such as toluic aldehyde, naphthaldehyde, furfuraldehyde, glyoxal, acrolein, or compounds capable of engendering aldehydes such as paraformaldehyde, hexamethylene tetramine. The aldehydes can also be used in the form of a solution such as the commercially available formalin. The preferred aldehyde is formaldehyde.

While glycidyl ethers such as derived from epichlorohydrin are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl 2,3-epoxy-propane, 1-bromo-2,3-epoxy-pentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane. Although it is possible to use haloepoxyalkanes having a greater number of carbon atoms than indicated above, there is generally no advantage in using those having a total of more than 10 carbon atoms.

The preferred epoxidized novolak employed according to the present invention is represented by the formula:

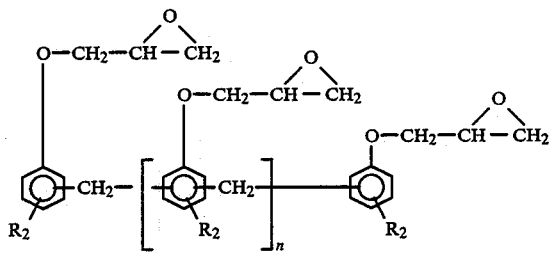

wherein n is at least about 1.5, wherein each $R_2$ individually is H or alkyl such as methyl or ethyl.

A preferred epoxidized novolak is a cresol-formaldehyde novolak, available under the trade designation Araldite 1280 from Ciba-Geigy.

The high functionality epoxy is employed in amounts of about 10 to about 30 parts per 100 parts by weight of resin solids.

The compositions of the present invention must also contain zinc oxide.

The zinc oxide powder employed in the present invention can be present in any of the various particle shapes available, with the preferred shape being spherical. Most of the ZnO commercially available in the United States is, in fact, spherical.

In addition, the particle size of the zinc oxide can vary over a wide range. The preferred zinc oxide particles have a particle size such that 100% passes through a 44 micron screen.

In order to achieve the necessary thermal conductivity without adversely affecting the other desirable properties of the composition, it is necessary that the zinc oxide be employed in amounts of about 40 to about 75, preferably about 40 to about 60, and most preferably about 50 parts by weight per 100 parts of resin solids.

Also included in the composition as a curing agent is dicyandiamide (cyanoquanidine). Such is usually employed in amounts of about 3 to about 4 parts per 100 parts by weight of the resin solids. It is conveniently incorporated into the composition as a solution in a suitable solvent such as ethylene glycol monomethyl ether.

The compositions also contain as a catalyst for the cure a tertiary amine. Suitable tertiary amines are benzyldimethylamine, α-methyl-benzyldimethylamine, dimethylaminomethylphenol, and tris (dimethylaminomethylphenol), with N,N,N',N'-tetramethyl-1,3-butane diamine being preferred.

The amine is usually employed in amounts of about 0.2 to about 0.4 and preferably about 0.3 parts per 100 parts by weight of the resin solids.

According to preferred aspects of the present invention, solvents are employed to achieve the desired consistency or viscosity for the compositions. Usually about 90 to about 100 parts by weight of solvent per 100 parts by weight of resin solids are employed. The amount of solvent is usually such that the composition without the zinc oxide has a specific gravity of 0.9 to 1.2.

Ethylene glycol monomethyl ether and methyl ethyl ketone serve as the preferred solvents. While ethylene glycol monomethyl ether and methyl ethyl ketone are the solvents of choice, other suitable solvents may also be used. For example, acetone or acetone and water may be used. Additionally, methyl ethyl ketone-dimethyl formamide can be used advantageously. Other suitable solvents in which the resin, curing agent, and catalyst are soluble can be used and are easily determinable by those skilled in the art.

The compositions of the present invention are used to impregnate woven glass fabric from which multilayer laminates, referred to as prepregs, are prepared. The prepreg is prepared using the type of equipment disclosed in U.S. Pat. No. 3,523,037, disclosure of which is incorporated herein by reference. The process of the present invention, however, employs temperatures of about 230° F. to about 300° F. to remove the solvents. The curing temperature after solvent removal is about 300° F. to about 350° F.

After this cure, which is to a partial or B stage, the now impregnated fabric or prepreg is divided into sheets of a desired size in preparation for lamination to form the printed circuit card or board. According to preferred aspects of the present invention, two sheets of prepreg, are employed. Because of the enhanced thermal conductivity of the laminate the ability to form laminates of only two prepreg sheets of a total post lamination thickness of about 4.4 to 5.5 mils is made possible.

After the prepreg is formed, two sheets are interleaved between sheets of electrolytic copper foil or other conductive material and placed between platens of a laminating press. The preferred copper being 3-ounce copper about 4 mils thick.

The platens are cored for steam or super-heated water so that they can be heated to a temperature of 350° or more. The above assembly is subjected to pressure which may vary from 50 psi to 800 psi. The laminate is maintained at this temperature and pressure for a time sufficient to cause flow of the resin and completes the curing of the resin to a degree where it will provide properties desired in the laminate. Typical cure times vary from 30 minutes to 120 minutes at 340° F.

Then a circuit can be etched to the conductive layer using techniques well-known to form circuit boards. The laminates prepared in accordance with the present invention exhibit good resistance to copper peeling.

The following non-limiting examples are presented to further illustrate the present invention.

EXAMPLE 1

About 50 parts by weight of ethylene glycol monomethyl ether are placed in a jacketed vessel equipped with a propeller type stirrer. This solvent is heated to 110° F. ±15° F. with agitation by circulating hot water through the jacket of the mixing vessel. When the solvent reaches a temperature of about 100° F., 3 parts of dicyandiamide are added thereto. Agitation is continued for 15 to 20 minutes to completely dissolve the dicyandiamide. When the dicyandiamide has been dissolved, the solution is cooled to room temperature.

In a separate mixing tank, about 10 parts by weight of a cresol-novolak epoxy having an epoxide functionality of 4 (Araldite 1280 from Ciba-Geigy) are added to about 90 parts by weight of a 75% solution in methyl ethyl ketone of polyglycidyl ether of tetrabromo bisphenol-A having an epoxide equivalent weight of about 455 to about 500 (Araldite 8011 from Ciba-Geigy) mixture is agitated. The dicyandiamide-glycol monomethyl ether solution is then added to the epoxy resin solution with stirring. The resulting solution is adjusted to a specific gravity of 1.085±0.005 (e.g., by the addition of about 40 parts of methyl ethyl ketone to the above solution).

The resulting epoxy resin composition may be stored up to about 3 days. When the epoxy resin composition is ready to be used to impregnate the glass fabric, 0.3 parts of N,N,N',N'-tetramethyl-1,3-butane diamine are added with stirring thereto 4 to 6 hours prior to the impregnation operation.

After aging for about 4 to about 6 hours, zinc oxide is added to the composition in a weight ratio of 1 part of zinc oxide per each 2 parts by weight of epoxy polymer solids. By adding the zinc oxide after aging, the cure is prolonged.

The composition is then used to impregnated glass fabric that is free of hollow filament following the procedure discussed hereinabove.

Two sheets of the above prepreg are laminated between 20 mil and two ounce copper. The laminate is circuitized and then profiled into individual cards. The thickness of the dielectric layer is measured by magnification of a cross-section of a sample card.

Thermal resistance measurements are made at 25° C. ambient with no forced air flow. Temperature measurements are made with thermocouples and an infrared thermometer. Heat is generated in a diode (D-pak) that is surface-mounted to the card. Temperatures are measured on the D-pak body and directly through the card behind the D-pak. The thermal resistance is heat supplied to the D-pak.

The thermal resistance of the card that contains 2.2 mil of the zinc oxide enhanced epoxy composition is 2.13° C./Watt. This compares to a value of 5.3° C./Watt for a card having 2 mils on each prepreg of the same epoxy composition, but without the zinc oxide.

The thermal conductivity of the prepreg that contains the zinc oxide enhanced epoxy composition is about 1.070 Watts/meter°C. This compares to a value of 0.394 Watts/meter°99C. for prepreg of the same epoxy composition without the zinc oxide.

Having thus described our invention, what we claim as new and desire to secure by Letters Patent is:

1. A composition comprising:
   (A) about 70 to 90 parts per 100 parts by weight of resin solids of a tetrabrominated diglycidyl ether of a phenol polyepoxide;
   (B) about 10 to about 30 parts per 100 parts by weight of resin solids of an epoxy polymer having functionality of about 3.5 to about 6;
   (C) about 40 to about 75 parts by weight per 100 parts of resin solids of zinc oxide;
   (D) about 3 to about 4 parts per 100 parts by weight of resin solids of dicyandiamide; and
   (E) about 0.2 to about 0.4 parts per 100 parts by weight of resin solids of a tertiary amine.

2. The composition of claim 1 wherein said tetrabrominated diglycidyl ether is a polyepoxide of epichlorohydrin and tetrabrominated bisphenol-A.

3. The composition of claim 1 wherein said epoxy polymer having functionality of 3.5 to 6 is an epoxidized phenolic novolak.

4. The composition of claim 3 wherein said epoxidized phenolic novolak is an epoxidized cresol-formaldehyde novolak.

5. The composition of claim 1 wherein said zinc oxide is present in amounts of about 40 to about 60 parts per 100 parts of epoxy solids.

6. The composition of claim 1 wherein said zinc oxide is present in an amount of about 50 parts per one 100 parts of epoxy solids.

7. The composition of claim 1 wherein said tertiary amine is N,N,N',N'-tetramethyl-1,3-butane diamine.

8. The composition of claim 1 which further includes a solvent.

9. The composition of claim 8 wherein said solvent includes methyl ethyl ketone.

10. The composition of claim 8 wherein said solvent includes methyl ethyl ketone and ethylene glycol monomethyl ether.

11. An article comprising glass fabric impregnated with the composition of claim 1.

12. The article of claim 11 wherein two sheets of the impregnated glass fabric are laminated together to form a dielectric for a circuit board or card.

13. The article of claim 12 having a thickness of about 4.4 to about 5.5 mils.

14. A method of preparing prepregs comprising:
   (A) immersing woven glass fiber in the composition of claim 1; and
   (B) passing the epoxy impregnated glass fabric through an oven at temperatures of about 300° F. to about 350° F. to partially cure the composition.

15. The method of claim 14 wherein said composition further includes a solvent and wherein the impregnated glass fabric is passed through an oven at temperatures of about 230° F. to about 300° F. to cause evaporation of said solvent and then at temperatures of about 300° F. to about 350° F. to partially cure the composition.

* * * * *